PRINTED CIRCUIT MANUFACTURING METHOD

Original Filed Aug. 12, 1960 2 Sheets-Sheet 1

*INVENTOR.*
BERNARD MARC TARAUD
*BY*
Kenyon, Palmer, Stewart & Estabrook
ATTORNEYS PRINTED CIRCUIT MANUFACTURING METHOD
Original Filed Aug. 12, 1960 2 Sheets-Sheet 2
FIG. 10
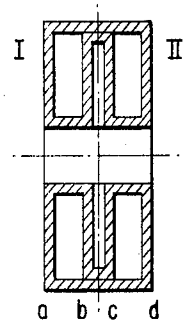
FIG. 11
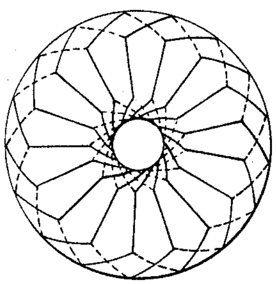
FIG. 12
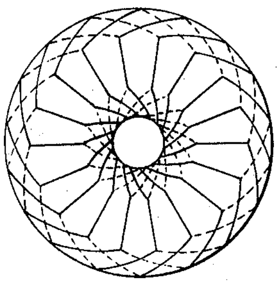
FIG. 13
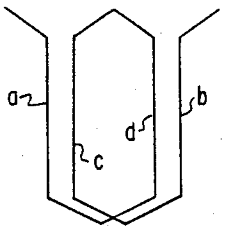
FIG. 14
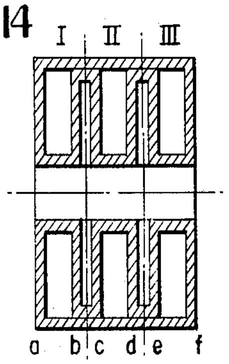
FIG. 15
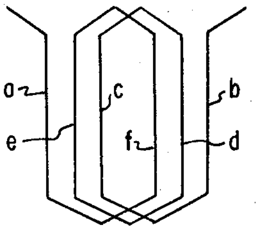
FIG. 16
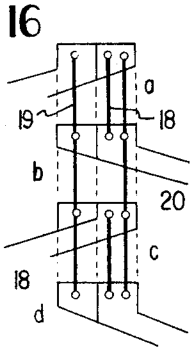
FIG. 17
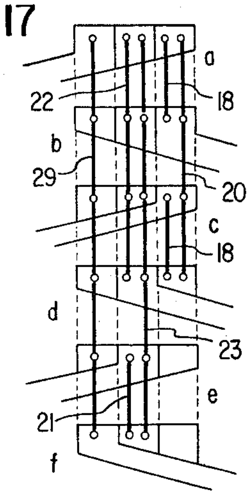
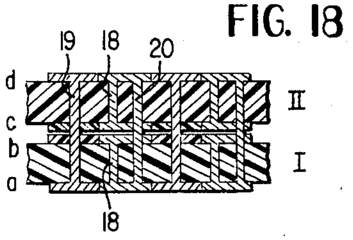
FIG. 19
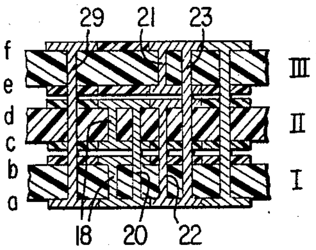
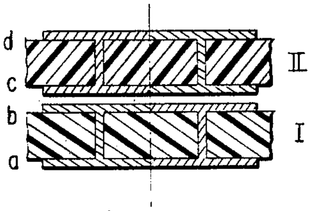
FIG. 20
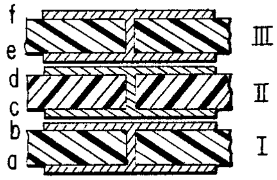
FIG. 21
INVENTOR.
BERNARD MARC TARAUD
BY
Kenyon, Palmer, Stewart & Estabrook
ATTORNEYS United States Patent Office 3,397,452

Patented Aug. 20, 1968

3,397,452

PRINTED CIRCUIT MANUFACTURING METHOD

Bernard Marc Taraud, Vanves, Hauts-de-Seine, France, assignor to Société d'Electronique et d'Automatisme, Courbevoie, Hauts-de-Seine, France Continuation of application Ser. No. 49,215, Aug. 12, 1960. This application Sept. 9, 1966, Ser. No. 578,412
Claims priority, application France, Feb. 9, 1960, 818,137, Patent 1,256,632
4 Claims. (Cl. 29—625)

ABSTRACT OF THE DISCLOSURE

This invention relates to the method of interconnecting interior circuit conductors of multilayer circuit panels by forming isolated terminal areas on the face of each of the circuit panel, forming holes through the terminal areas and the interior conductors and then metallizing the holes. The panels are then secured together. Additional holes are formed by the terminal areas and metallized to interconnect the same.

This application is a continuation of application Ser. No. 49,215 filed Aug. 12, 1960, now abandoned.

The present invention relates to the manufacturing of printed circuits i.e. of members wherein a plurality of flat conductors are intimately secured over insulating surfaces and it relates more particularly to the kind of such printed circuits which may be said to be "sandwiches" in that several conductor layers are united with intermediary thin insulating layers separating them both mechanically and electrically and wherein definite connections must be provided between the various conductor layers.

It is the object of the invention to enable the manufacturing of such sandwiches with efficient through-connections between the conductor layers however thin are the said intermediary insulating layers and however many layers of conductors are to be interconnected.

A detailed disclosure of the present invention will be made with reference to the attached sheets of drawings in which FIG. 1 is a sectional view of a face to face connection between conductive coatings disposed on opposite faces of insulating panels;

FIG. 10 shows a false cross-section view of such a two-winding armature, one of said windings being of the kind of pattern shown in FIG. 11 and the other one of the kind of pattern shown in FIG. 12, said windings being interconnected according to the electrical scheme of FIG. 13;

FIG. 14 shows a false cross-section view of such an armature with three windings, one of the kind of pattern of FIG. 11, the other two of the kind of pattern of FIG. 12, said three windings being interconnected according to the electrical scheme of FIG. 15;

FIGS. 16 and 17 show partial views of external or outer peripheries of the windings of FIGS. 13 and 15, respectively, said views being schematics for a better understanding of the application of the invention in such a case;

Figure 8:
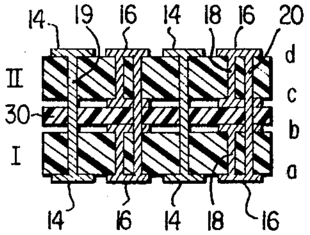
FIG. 8 is an sectional view similar to FIG. 7, showing the complete electrical interconnection between conductors on the adjacent surfaces of the two panels.
Figure 9:
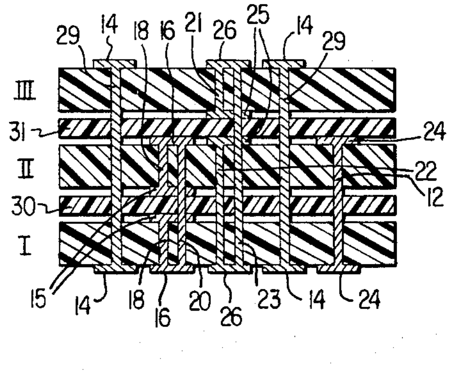
FIG. 9 is a view similar to FIG. 8 showing a three panel sandwich.

FIGS. 18 and 19 show cross-section views, to be compared to FIGS. 8 and 9, showing one location of interconnections between the windings of FIGS. 10 and 14 at their outer peripheries; and, FIGS. 20 and 21 show views in cross-section of parts of the inner peripheries of said windings of FIGS. 10 and 14.

Figure 1:
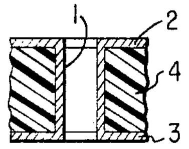
FIG. 1 PRIOR ART

For establishing a face-to-face connection in an elementary kind of sandwich, merely comprising two conductor layers on opposite sides of an insulating layer, the usual procedure is as follows: the insulator is perforated at the desired place, said perforation extending through the conductors on both faces and, from any well known and conventional process, such a hole is metallized, viz. the wall of the hole is coated with a metallic deposit from one end to the other which joins the two conductor layers on opposite faces of the insulating layer, both mechanically and electrically. This results, as shown in FIG. 1, in a face-to-face connection bridge 1 between conductive coatings 2 and 3 secured to the faces of an insulating sheet 4.

Figure 2:
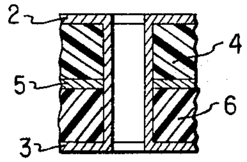
FIG. 2 PRIOR ART
FIG. 2 is a similar view showing an attempted connection between three conductive coatings separated by two insulating panels.

In order that such a process be efficient, i.e. give connections of great strength both mechanically and electrically, it is known that, the step of metallizing the hole must be processed with both conductor coatings accessible so that they may be freely exposed to the metallizing apparatus and that the metallization actually adheres as well to said coatings as to the wall of the hole. When for instance, FIG. 2, one attempts to ensure an interconnection between three conductive coatings 2, 3 and 5, spaced by the insulating layers 4 and 6, by means of the metallization of a hole after the assembly of the sandwich is made, which renders unavailable the coating 3, except for the narrow edge area, the connection of the coatings 2 and 5 will be duly ensured but the connection of the coating 3 to coatings 2 and 5 will be an uncertain one as a slight overvalue of current therethrough will destroy such connection at the edge of coating 3. This eliminates the main advantage of printed circuitry which is, as known, the ability to carry quite higher values of current than an identical section non-printed conductors. An interconnection between 3 and 2 or between 3 and 5 made as above would be all the more easy to break if the insulating layer were thinner.

Figure 3:
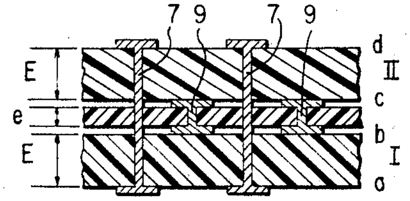
FIG. 3 PRIOR ART
FIG. 3 is a sectional view of a pair of insulating panels having printed conductors on the upper and lower faces of each, and with two panels formed in a sandwich.
Figure 4:
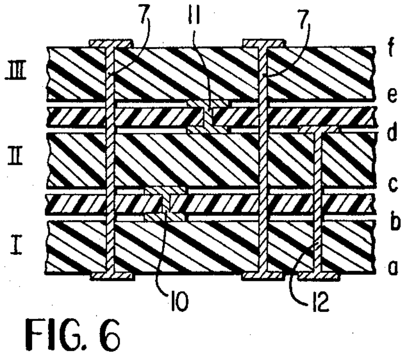
FIG. 4 PRIOR ART
FIG. 4 is a similar view showing three such panels in sandwich form.

In actual practice, it is often required to provide sandwiches comprising at least two two-faced printed circuits such as I and II, FIG. 3, or more than two and for instance three as shown at I, II and III on FIG. 4. The interconnection of such elementary two-face circuits are made with the interposition of an insulating layer such as glue, resin, or varnish, of very small thickness $e$ with respect to the thickness E of the insulating layer in each two-faced circuit element. Of course, connections may be provided as well between conductors appearing at the end faces of the circuit elements of the sandwich as between the faces of the circuit elements which are separated only by the said glue or varnish or resin. "Through connections" are shown at 7 in FIG. 3 and FIG. 4; intermediary connections are shown at 9 in FIG. 3 and at 10 and 11 in FIG. 4. Numbering the "levels" of the conductive coatings in a sandwich, one may say that connections must be made as well between intermediary levels such as $b$ and $c$ in FIG. 3, or levels $b$, $c$, $d$ and $e$ in FIG. 4 as between the outer or external levels such as *a* and *d* in FIG. 3 or *a* and *f* in FIG. 4. On the other hand, such an interconnection as 12 in FIG. 4 may be normally made once the elements I and II are united but prior to the union of element III over element II, this being possible since both coatings are then accessible.

On the other hand, making interconnections by metallizing holes presents definite advantages: such connections do not introduce any electrical discontinuity or heterogeneity in the circuits, which is not the case when through connections are made with non-integral tabs or rivets; it further enables making such connections between conductive coatings of very small areas, even if such areas are contiguous; and obviously, it enables making through-connections at any required place in the areas covered by the conductive coatings. It is consequently highly desirable to maintain the use of metallization of holes for ensuring interconnections in printed-circuit sandwiches of the above defined kind.

According to the invention, any interconnection between two conductive areas facing each other in the assembly of two-faced circuit elements (either one or both of said elements being simple single carrier elements or preformed composite elements made by the piling of several simple elements) is made in three steps: first, on the face of the carrier opposite to that bearing the conductor area to be connected, an additional conductive small terminal area is established which, when the elements are assembled, will be exposed and on an outer face of the carrier consequently will be available for making the through-connection by metallization; second, in both concerned elements, connections by hole metallization are established between said additional terminal areas and the conductor areas to be finally interconnected from one element to the other one; and third, once the circuit elements are assembled, a connection by hole metallization is established between the two exposed conductor areas; so that finally, the two required conductive areas are connected by connections passing to additional terminal areas. Preferably, all hole metallizations are parallel to one another.

Figure 5:
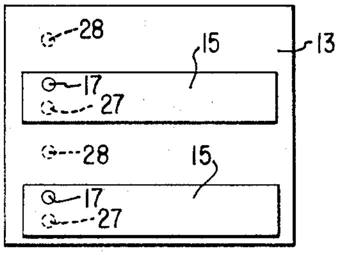
FIG. 5 is a plan view of an insulating panel having printed conductors on one surface thereof.
Figure 6:
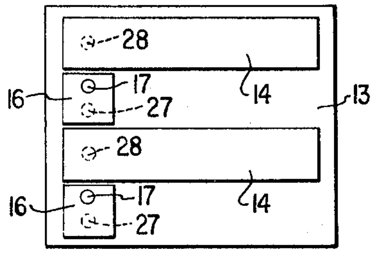
FIG. 6 is a plan view of the reverse side of the panel shown in FIG. 5.
Figure 7:
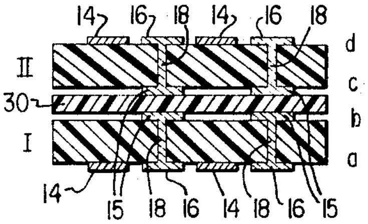
FIG. 7 is a sectional view showing a sandwich construction of two identical panels of the type shown in FIGS. 5 and 6.

Considering first the embodiment of interconnections shown in FIG. 3 and assuming that in such circuit the conductors are mere elongated coating 15 on one face and 14 on the other face, see FIGS. 6 and 5, the insulating carrier being shown at 13 in said figures, this being true for each of the members I and II of FIG. 3. On the face carrying the coatings 14, are formed according to the invention, additional small area terminal coatings 16, FIG. 5 which actually, when assembled, will register with the ends of the coatings 15 on the other face of the member. Holes 17 are bored for connecting the conductors 15 to the "terminals 16" and the hole metallization process is applied to form said connections between 15 and 16. Such connections are shown at 18 in the cross-section view of FIG. 7, which shows the thus prepared members I and II glued together by an insulating layer 30. In such an assembly the holes 27 and 28 shown in dot lines in FIGS. 5 and 6 are then bored. Then these latter holes are metallized which results in the connections 20 and 19 in FIG. 8.

It is seen that the connections between the parts 15 at the intermediary levels *b* and *c* are connected by a circuit comprising 18, 16, 20, 16, 18 from one level to the other one. The connections 20 are metallized hole connections formed in holes 27 extending between the terminals 16 located on opposite faces of the sandwich and the connections 18 are metallized hole connections formed in holes 17 between the terminals 16 and the conductors 15, as required. Obviously, such connections as 19 are also metallized connections formed in holes 28 between the conductors 14 located on the outer faces of the sandwich.

FIG. 9 shows the cross-section obtained in similar conditions for the three member sandwich of FIG. 4. For manufacturing such a composite circuit, one begins by following the same procedure as above described for members I and II in that part thereof concerning the connections between the conductors 15 at the intermediary levels *b* and *c*. But a further interconnection must be made between the levels *d* and *e* between conductor parts 25, one on the member II, the other one on the member III. Such a connection may be prepared, in accordance with the invention, by providing a terminal 26 on the bottom face of member I. After assembly of the members I and II, a metallized hole connection is made between said terminal 26 and the conductor part 25 at the upper face of member II. Connections 12 are simultaneously made between other parts 24 of this first assembly. Member III has been prepared with a further terminal 26 on its upper face and a metallized hole connection 21 is made between said upper terminal 26 and the conductor part 25 carried by said member III. Then the member III is glued over the assembly of members I and II and a metallized hole connection 23 is made between the exposed terminals 26 of the external faces of such an assembly. Such metallized connections as 29 are simultaneously made between conductor parts 14 on the external faces of the assembly.

The layers 30 and 31 are, as said, very thin layers of glue or varnish or resin for uniting the members of the sandwich.

The manufacturing of sandwiches comprising more than three members is apparent from the above.

It should be noted that instead of establishing a straight-through connection 22 between members I and III, it would have been possible to first establish face to face connections in the members I, II and III, then glue II over I and make a through connection between the exposed faces of I and II and thereafter glue III over II and complete the through connection. But in such a case, three holes would have had to be provided in the parts 25, so that it appears that is is preferable to manufacture as described with reference to FIG. 9.

The invention is obviously applicable to any multilayer printed circuits requiring varied connections between the layers and for illustration thereof, the case of manufacturing multiple winding armatures for axial airgap machines will be described. In order to better define the structure, it will be assumed that the first winding is of the series-wave type, FIG. 11 and the other or others is or are of the lap type, FIG. 12. An armature winding of the series wave type shown in FIGURE 11 is constructed like that shown in the patent of Swiggett 2,970,238, see FIGURES 3 and 4.

FIGURE 10 shows a two-unit winding where the conductors for unit I are located in the planes *a* and *b* on opposite faces of an insulating carrier, and the conductors for the second unit II are located in the planes *c* and *d* on opposite faces of a second insulating carrier arranged as a sandwich on unit I.

FIG. 10 shows a cross-section view of a two-winding armature. This cross-section is false in that the actual connections are indicated in the plane of the paper, which is not true, so that the conductors appear closed on themselves which is not the case for each turn thereof. However the electrical scheme of FIG. 13 gives the wiring diagram. In the series-wave winding of FIG. 11, 17 conductors per face are provided and consequently 17 turns each having one half-turn conductor on each face of member I and these turns progress in several revolutions around the annular carrier for forming the complete winding. In the lap winding of FIG. 12, 16 conductors per face are present, each turn comprising a "front face" and a "rear face" conductor on the member II so that they regularly overlap one another. The half-turn conductors of the series wave winding being in the *a* and *b* planes are then, as shown in FIG. 13, connected through a complete turn of the lap winding the half-turn conductors of which are situated in the *d* and *c* planes respectively. A conductor of level or plane *b* will be connected to the next conductor of level or plane *a* in the series-wave winding, and so forth.

Such a winding structure necessitates connections between the extreme levels *a* and *d*, connections between the levels *a* and *b* and between the levels *c* and *d*, as well as connections between the intermediary levels *b* and *c*. The connections between the intermediary levels and between the extreme levels are grouped in the outer periphery of the armature, and the connections between levels of the same member, I or II, are grouped at the inner periphery of the armature.

A similar consideration applies to the three member winding armature of FIG. 14, the electrical arrangement is shown for a turn of the series-wave winding in FIG. 15. In this arrangement, member I carries a series-wave winding and members II and III each carry a lap winding. The connections between the pairs of intermediary levels *b–c* and *d–e* are grouped at the outer periphery of the armature together with the connections between the extreme levels *a–f* and the connections between the pairs of levels in each member are grouped at the inner periphery of the armature.

However, an inspection of FIGS. 11 and 12 clearly shows that for ensuring connections between intermediary levels according to the invention, no available place for additional terminals is apparent. But a further inspection shows that at least at the outer periphery of the printed winding patterns the area of each end of half-turn conductor flares and consequently such a complete area is not imperative for the end connections of such conductors. It is then simple to provide at the printing process proper, subdivided terminal areas at the outer periphery of conductors which leave the required "additional" terminals available. Such subdivision is indicated in FIG. 16 for the sandwich of FIG. 10 and in FIG. 17 for the sandwich of FIG. 14. The subdivided areas of the different levels are shown one under the other in said FIGS. 16 and 17 for the sake of clarity but said areas will be superposed in the actual structure.

In FIG. 16, each terminal area is divided in two parts at level *a*. It is the left-hand part which is connected (integral) to the half-turn conductor and the right-hand part is insulated from the left-hand one. At level *b*, it is the right-hand part of the terminal which is connected to the half-turn conductor and the left-hand part of the terminal which is left insulated by said division. At level *c* the condition of level *a* is found again and at level *d*, it is the condition of level *b*. The hole metallization 19, FIGS. 16 and 18, then connects the end areas of the conductors of levels *a* and *d*, passing through insulated areas at levels *b* and *c*; the hole metallizations 18 connect respectively the conductor of level *b* to an insulated area of level *a* and the conductor of level *c* to an insulated area of level *d* but said insulated areas are interconnected by the hole metallization 20 and consequently the conductors of levels *b* and *c* are effectively interconnected.

In FIG. 17, each terminal area is divided in three sections: at level *a*, it is the left-hand section which is reached by the half-turn conductor; in levels *b* and *c* the right-hand sections are connected to the half-turn conductors; in levels *d* and *e*, the middle sections are connected to the half-turn conductors; and in level *f*, the same condition as in level *a* is again found. Consequently, FIGS. 17 and 19, the hole metallization 29 connects the conductors of the levels *a* and *f*, passing through insulated areas in the intermediary levels. The hole metallizations 18 connect the conductors of the levels *b* and *c* to insulated areas of levels *a* and *d* but said areas are connected by hole metallization 20, so that said conductors are efficiently connected as required. The conductors of levels *d* and *e* are respectively connected by hole metallizations 22 and 21 to insulated sections of levels *a* and *f* but said sections are connected by hole metallization 23 so that said conductors are effectively connected. All these connections are made without any risk of short-circuiting conductors between levels in the sandwich.

At the inner peripheries, on the other hand, no special problem arises and the hole metallizations are normally made in each member prior to their glueing together, as clearly shown by the cross-section views of FIGS. 20 (for the structure of FIG. 10) and 21 (for the structure of FIG. 14).

As used herein, the term "metallization" refers to known processes of forming a metal coating on insulating surfaces, and to the coatings produced by such processes. The term "hole metallization" refers to a metallic coating on the inner surface of a hole formed through an insulating member, the coating extending throughout the length of the hole and at least partially in the exposed area surrounding the ends of the hole.

I claim:

1. A method of manufacturing printed circuits of the type including in a sandwich a plurality of insulating panels having printed circuit conductors on both faces, adjacent panels in said sandwich being glued together in face-to-face relation and having a very thin insulating layer interposed between them, and wherein not only face-to-face connections must be made in each panel through metallized holes in the panel connecting conductor parts on opposite faces of the panel, but further connections must be made between inner conductors located within said sandwich and separated only by said very thin insulating layers, said method comprising the steps of forming isolated conductive terminal areas on the face of each of the panels opposite the face carrying the inner conductors which are to be connected and in registry with parts of said inner conductors respectively; forming a first hole through each such terminal area, panel and corresponding conductor; metallizing said first hole to connect corresponding terminal areas and conductors; gluing the panels into a sandwich with said isolated conductive terminal areas on the outside of the sandwich; forming a second hole through each said isolated conductive terminal area, said second hole extending entirely through the sandwich; and then metallizing said second hole to connect corresponding terminal areas on opposite sides of the sandwich, thereby establishing metallized hole connections between conductors located within the sandwich.

2. Method according to claim 1, wherein the said isolated conductive terminal areas are made as additional metallized areas of the member carriers.

3. Method according to claim 1, wherein the said isolated conductive terminal areas are made of parts of conductors on the faces of said panels which are separated from the conductors by insulating gaps.

4. The method according to claim 1 wherein said second hole is made parallel to said first hole.

References Cited

UNITED STATES PATENTS

| | | | |
|---|---|---|---|
| 2,502,291 | 3/1950 | Taylor. | |
| 2,907,925 | 10/1959 | Parsons. | |
| 3,102,213 | 8/1963 | Bedson et al. | 174—68.5 |

DARRELL L. CLAY, *Primary Examiner.*